US011850702B2

(12) United States Patent
Chen et al.

(10) Patent No.: US 11,850,702 B2
(45) Date of Patent: Dec. 26, 2023

(54) CHEMICAL MECHANICAL PLANARIZATION MEMBRANE

(71) Applicant: Taiwan Semiconductor Manufacturing Company, Ltd., Hsin-Chu (TW)

(72) Inventors: Cheng-Ping Chen, Taichung (TW); Ren-Dou Lee, Hsinchu (TW); Sheng-Tai Peng, Miaoli County (TW); Tsung-Lung Lai, Hsinchu (TW); Tzi-Yi Shieh, Hsinchu (TW); Chien-Wei Chang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/685,760

(22) Filed: Mar. 3, 2022

(65) Prior Publication Data

US 2022/0184773 A1    Jun. 16, 2022

Related U.S. Application Data

(63) Continuation of application No. 15/994,088, filed on May 31, 2018, now Pat. No. 11,267,099.

(60) Provisional application No. 62/563,701, filed on Sep. 27, 2017.

(51) Int. Cl.
| | | |
|---|---|---|
| *B24B 37/32* | (2012.01) | |
| *B24B 37/015* | (2012.01) | |
| *B24B 37/20* | (2012.01) | |
| *H01L 21/321* | (2006.01) | |

(52) U.S. Cl.
CPC ............ *B24B 37/32* (2013.01); *B24B 37/015* (2013.01); *B24B 37/20* (2013.01); *H01L 21/3212* (2013.01)

(58) Field of Classification Search
CPC ......... B24B 37/20; B24B 37/27; B24B 37/30; B24B 37/32; B24B 37/015; B24D 18/0009; B29C 43/52; B29C 2043/522
See application file for complete search history.

(56) References Cited

U.S. PATENT DOCUMENTS

| 5,885,135 A | 3/1999 | Desorcie et al. |
|---|---|---|
| 6,210,255 B1 | 4/2001 | Zuniga et al. |
| (Continued) | | |

FOREIGN PATENT DOCUMENTS

| JP | 2015071197 A | 4/2015 |
|---|---|---|
| KR | 20010083394 A | 9/2001 |
| TW | I531443 B | 5/2016 |

OTHER PUBLICATIONS

Peng Wang. "Hydraulic structure tester" The Yellow River Water Conservancy Press, pp. 77-78, published on Mar. 31, 1996.

(Continued)

*Primary Examiner* — Joel D Crandall
(74) *Attorney, Agent, or Firm* — Eschweiler & Potashnik, LLC (57) ABSTRACT

In some embodiments, the present disclosure relates to a chemical mechanical planarization (CMP) tool. The CMP tool includes a carrier and a malleable membrane coupled to the carrier and having a lower surface facing away from the carrier. The lower surface of the malleable membrane includes a first malleable material within a central region of the lower surface and a second malleable material within a peripheral region of the lower surface, which surrounds the central region. The first malleable material provides the central region of the lower surface with a first stiffness and the second malleable material provides the peripheral region of the lower surface with a second stiffness that is different than the first stiffness.

20 Claims, 9 Drawing Sheets

(56) References Cited

U.S. PATENT DOCUMENTS

| | | | |
|---|---|---|---|
| 6,277,014 | B1 | 8/2001 | Chen et al. |
| 9,399,277 | B2 | 7/2016 | Yoshida et al. |
| 2002/0049024 | A1* | 4/2002 | Zuniga .................... B24B 37/30 451/8 |
| 2002/0164938 | A1 | 11/2002 | Chen et al. |
| 2002/0173240 | A1* | 11/2002 | Wang .................... B24B 37/30 451/41 |
| 2003/0181061 | A1* | 9/2003 | Ebner .................... B24B 41/06 438/759 |
| 2003/0216199 | A1 | 11/2003 | Summerfield |
| 2004/0241049 | A1 | 12/2004 | Carvalho |
| 2007/0173240 | A1 | 7/2007 | Lim |
| 2015/0311097 | A1* | 10/2015 | Yoshida ............ H01L 21/67219 438/692 |

OTHER PUBLICATIONS

Fricher. "Plastic equipment and processing technology" Hunan Science and Technology Press, pp. 563-564, published on Dec. 31, 2014.

Jianmao Tang. "Green composite material" China Railway Press, p. 111, published on Dec. 31, 2016.

Longwei Hu. "Fastener Material Handbook" China Aerospace Press, p. 459, published on Dec. 31, 2014.

Senji Wu. "Silicone and its applications" Science and Technology Literature Press, pp. 212-215, published on May 31, 1990.

Xiaoyan Zhang."Research on high temperature resistant silicone resin and its curing system" Full-text Database of China's Excellent Doctoral and Master Dissertations, pp. 37-43, published on Jun. 15, 2002.

Non-Final Office Action dated Jun. 23, 2020 for U.S. Appl. No. 15/994,088.

Final Office Action dated Nov. 17, 2020 for U.S. Appl. No. 15/994,088.

Non-Final Office Action dated Apr. 15, 2021 for U.S. Appl. No. 15/994,088.

Notice of Allowance dated Oct. 28, 2021 for U.S. Appl. No. 15/994,088.

"UV-Curing Silicone Rubbers Enable New Medical Concepts and Part Design." MODI Qmed. Jun. 18, 2013. <https://www .mddionli ne .com/materials/uv-curi ng-silicone-rubbers-enable-new-medical-concepts-and-part-designs>. (Year: 2013).

* cited by examiner

CHEMICAL MECHANICAL PLANARIZATION MEMBRANE

REFERENCE TO RELATED APPLICATIONS

This application is a Continuation of U.S. application Ser. No. 15/994,088, filed on May 31, 2018, which claims the benefit of U.S. Provisional Application No. 62/563,701, filed on Sep. 27, 2017. The contents of the above-referenced patent applications are hereby incorporated by reference in their entirety.

BACKGROUND

Integrated chips are constructed using complex fabrication processes that form a plurality of different layers on top of one another. Many of the different layers are patterned using photolithography, a process by which a photosensitive material is selectively exposed to electromagnetic radiation. For example, photolithography may be used to define back-end-of-the-line (BEOL) metal interconnect layers that are formed on top of one another. To ensure that the metal interconnect layers are formed with a good structural definition, the electromagnetic radiation must be properly focused. To properly focus electromagnetic radiation, a workpiece must be substantially planar to avoid depth of focus problems. Chemical mechanical planarization (CMP) is a widely used process by which both chemical and mechanical forces are used to globally planarize a semiconductor workpiece. The planarization prepares the workpiece for the formation of a subsequent layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-9 illustrate some embodiments of a method of forming a CMP membrane having regions with different values of malleability and/or stiffness.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A chemical mechanical planarization (CMP) process is process performed by a CMP tool during integrated chip fabrication to form a flat (i.e., planar) surface upon which an overlying layer can be formed. CMP tools typically comprise a carrier configured to receive a semiconductor substrate. The carrier comprises a membrane that is surrounded by a retainer ring. A CMP process may be performed by inserting a substrate into the retainer ring in an upside down configuration in which a back-side of the substrate contacts the membrane. The carrier is subsequently moved to bring a front-side of the substrate into contact with a polishing pad before moving the polishing pad and carrier relative to one another to polish the front-side of the substrate.

During operation of the CMP tool, the membrane is configured to apply pressure to the back-side of the substrate. By adjusting a pressure that is applied to the back-side of the substrate, a removal rate of the CMP tool can be adjusted (e.g., the greater the pressure applied to the back-side of the substrate, the larger the removal rate). However, it has been appreciated that due to a ridigity of the membrane, the pressure that the membrane applies to the back-side of the substrate may be non-uniform. For example, a first pressure the membrane applies along outer edges of the substrate may be less than a second pressure the membrane applies to a center of the substrate. The difference in pressures applied to the substrate causes the CMP tool to have a lower removal rate along outer edges of the substrate than at a center of the substrate, resulting in non-planarity issues on the front-side of the substrate.

The present disclosure, in some embodiments, relates to a method of forming a CMP membrane that is configured to mitigate non-uniformities in pressure applied to a substrate during a CMP process, and an associated apparatus. The method comprises providing a malleable material within a cavity defined by a membrane mold having a peripheral region surrounding a central region. The malleable material is cured to form a membrane, by heating the malleable material within the central region of the membrane mold to a first temperature and heating the malleable material within the peripheral region of the membrane mold to a second temperature that is greater than the first temperature. The second temperature is configured to provide a peripheral region of the membrane with a lower stiffness than a central region of the membrane. The lower stiffness of the peripheral region allows the peripheral region of the membrane to expand by a larger amount than the central region of the membrane. The expansion of the peripheral region increases surface contact between the membrane and the substrate, and accordingly reduces non-uniformities in a pressure the membrane applies to a substrate by increasing a pressure that the membrane is able to apply to the periphery of the substrate.

Figure 1:
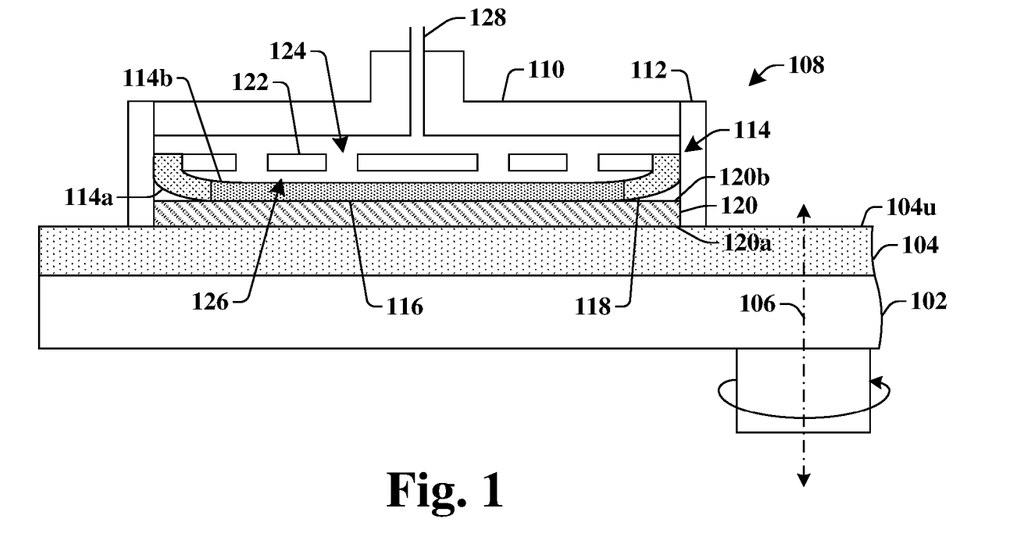
FIG. 1 illustrates a cross-sectional view of some embodiments of a chemical mechanical planarization (CMP) tool comprising a carrier including a membrane having regions with different values of malleability and/or stiffness.

FIG. 1 illustrates a cross-sectional view of some embodiments of a chemical mechanical planarization (CMP) tool 100 comprising a carrier including a membrane having regions with different values of malleability and/or stiffness.

The CMP tool 100 comprises a polishing pad 104 disposed over a platen 102 configured to rotate about a first axis of rotation 106 during operation of the CMP tool 100. The polishing pad 104 comprises a roughened upper surface 104u facing away from the platen 102. The CMP tool 100 further comprises a carrier 108. The carrier 108 is configured to house a substrate 120 in an upside down position so that a front-side 120a of the substrate 120 faces away from the carrier 108. During operation, the carrier 108 is configured to bring the front-side 120a of the substrate 120 into contact with the polishing pad 104 while the platen 102 is rotating about the first axis of rotation 106.

The carrier 108 includes a housing 110 coupled to a retainer ring 112. The retainer ring 112 has sidewalls defining a retainer ring recess configured to receive the substrate 120. A membrane 114 is arranged within the retainer ring recess. The membrane 114 comprises a flexible material having a lower surface 114a facing away from the housing 110 and an upper surface 114b facing the housing 110. The lower surface 114a is configured to contact a back-side 120b of the substrate 120.

In some embodiments, the membrane 114 may be coupled to the retainer ring 112 by way of a support structure 122 disposed between the housing 110 and the membrane 114. The support structure 122 may comprise interior sidewalls defining a plurality of apertures 124 extending through the support structure 122. The plurality of apertures 124 are respectively in communication with one or more chambers 126 disposed between the support structure 122 and the membrane 114. The one or more chambers 126 are configured to have pressures set by one or more fluids and/or gases provided through the plurality of apertures 124 by way of an inlet 128 in the housing 110. The pressures within the one or more chambers 126 apply one or more forces that define a surface profile of the lower surface 114a of the membrane 114. In some embodiments, the one or more chambers 126 may comprise a single chamber located between the membrane 114 and the support structure 122. In other embodiments (not shown), the one or more chambers 126 may be concentrically divided into multiple separate chambers.

The membrane 114 comprises multiple forms of a same malleable material, which are configured to respectively have different values of malleability and/or stiffness. The different values of malleability and/or stiffness allow for different parts of the membrane 114 to respond differently to an applied force. For example, the different values of malleability and/or stiffness allow for different parts of the membrane 114 to change shapes differently when a force is applied, thereby enabling a pressure applied by the membrane 114 to the substrate 120 to be adjusted. In some embodiments, the malleable material is silicone. In alternative embodiments, the malleable material may be any material that is able to be formed (e.g., cured) in a manner that can result in different values of malleability and/or stiffness in different regions of the membrane.

In some embodiments, the membrane 114 may have a central region 116 and a peripheral region 118 located between the central region 116 and an outermost edge of the membrane 114. The central region 116 comprises a first form of the malleable material having a first malleability and/or a first stiffness and the peripheral region 118 comprises a second form of the malleable material having a second malleability that is greater than the first malleability and/or a second stiffness that is less than the first stiffness. For example, the central region 116 may comprise a first form of silicone that has a lower stiffness than a second form of silicone within the peripheral region 118.

The larger, first stiffness of the central region 116 gives the membrane a sufficient rigidity to enable the membrane 114 to have good control of a pressure applied on the substrate 120. The smaller, second stiffness of the peripheral region 118 allows for increased expansion of the membrane 114 within the peripheral region 118 when a force is applied to the upper surface 114b of the membrane 114 (e.g., when a force is applied to the upper surface 114b of the membrane 114, the membrane 114 within the peripheral region 118 may expand by a larger amount than the membrane 114 within the central region 116). The expansion of the membrane 114 within the peripheral region 118 increases surface contact between the membrane 114 and the substrate 120 within the peripheral region 118 and accordingly increases a pressure that the membrane 114 is able to apply to the substrate 120 within the peripheral region 118. By increasing a pressure that the membrane 114 is able to apply to the substrate 120 within the peripheral region 118, non-uniformities in pressure applied to the substrate 120 during a CMP process can be mitigated, resulting in an improved CMP profile (e.g., less height deviation over the substrate) that causes higher yield and less rework of substrates (i.e., improved CMP through-put).

Figure 2:
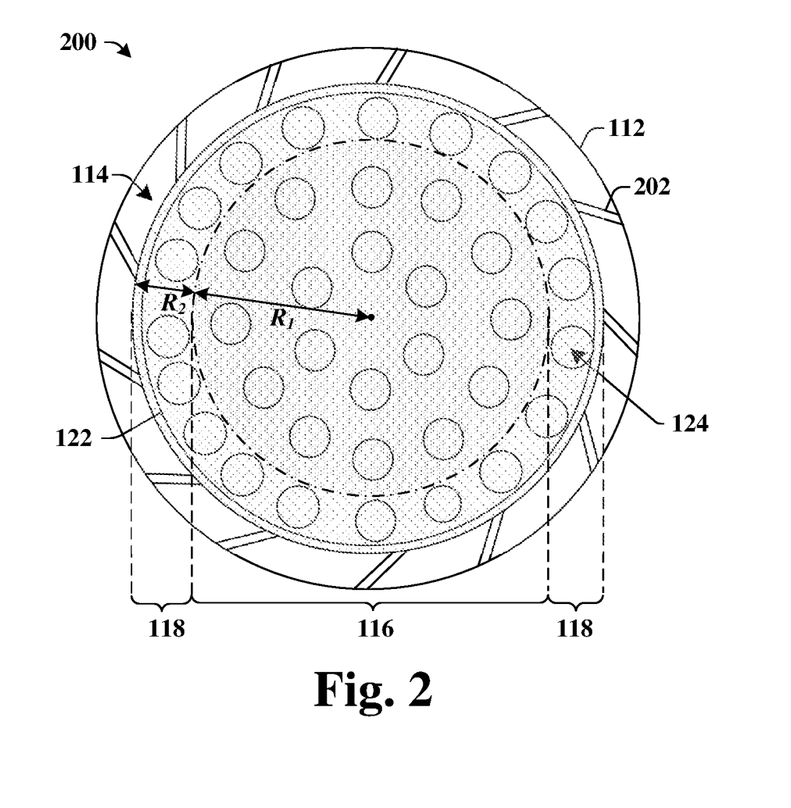
FIG. 2 illustrates a top-view showing some embodiments of a bottom of a carrier comprising a membrane having regions with different values of malleability and/or stiffness.

FIG. 2 illustrates a top-view showing some embodiments of a bottom of a carrier 200 comprising a membrane having regions with different values of malleability and/or stiffness.

The carrier 200 comprises a retainer ring 112 extending around a perimeter of a support structure 122. In some embodiments, a lower surface of the retainer ring 112 has a plurality of grooves 202 defined thereon. The plurality of grooves 202 comprise recesses in the retainer ring 112, which extend from an interior sidewall of the retainer ring to an exterior sidewall of the retainer ring 112.

The support structure 122 may comprise interior sidewalls defining a plurality of apertures 124 extending through the support structure 122. The plurality of apertures 124 are coupled to a high pressure fluid and/or gas source, which is configured to provide a high pressure fluid and/or gas through the plurality of apertures 124 to an upper surface of a membrane 114 arranged between interior sidewalls of the retainer ring 112.

The membrane 114 comprises a central region 116 having a first malleability and/or a first stiffness and a peripheral region 118 surrounding the central region 116 and having a second malleability that is greater than the first malleability and/or a second stiffness that is less than the first stiffness. In some embodiments, the central region 116 may extend to a radius $R_1$ from a center of the membrane 114, while the peripheral region 118 extends from the radius $R_1$ to a radius of $R_1$ from the center of the membrane 114. In other embodiments, the central region 116 and/or the peripheral region 118 may extend to different radii. In some embodiments, the radius $R_1$ may be larger than the radius $R_2$. In other embodiments, the radius $R_1$ may be smaller than the radius $R_2$. In some embodiments, the membrane 114 may comprise a transparent silicone, so that the support structure 122 is visible through the membrane 114.

Figure 3A:
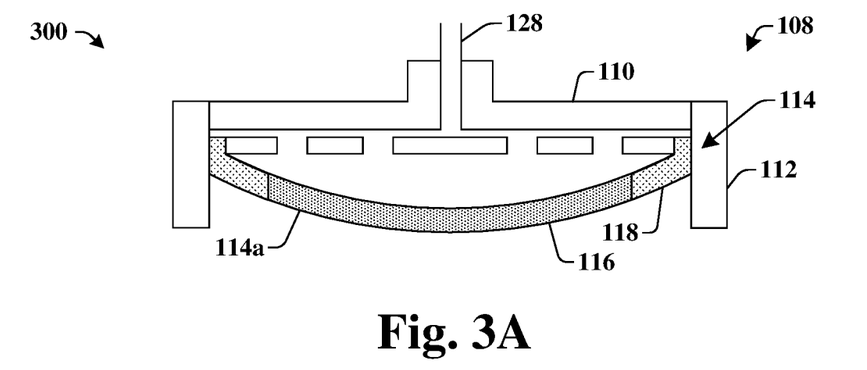
FIGS. 3A-3C illustrate cross-sectional views showing some embodiments of a carrier having a membrane having regions with different values of malleability and/or stiffness.
Figure 3B:
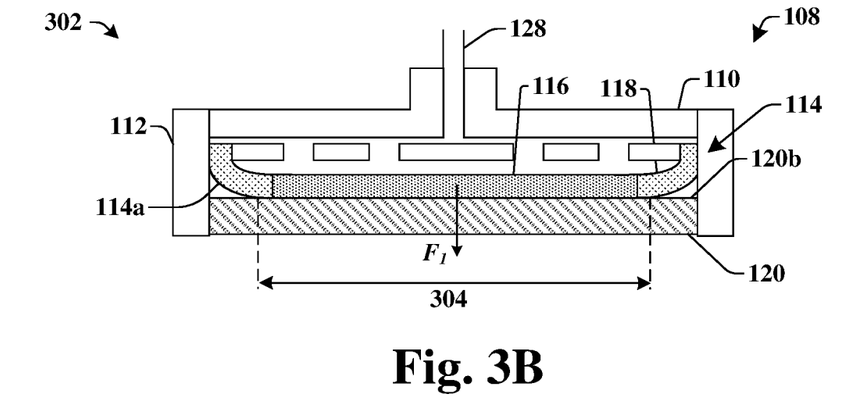
Figure 3C:
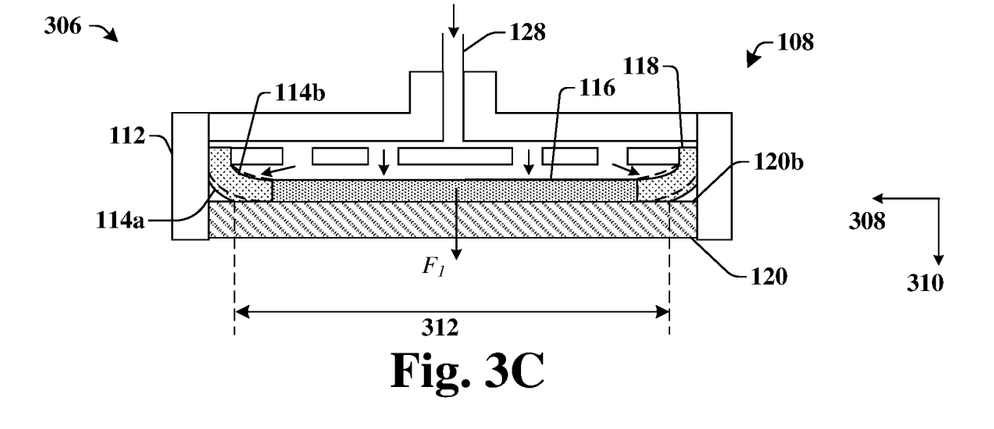

FIGS. 3A-3C illustrate cross-sectional views showing some embodiments of a carrier having a membrane including regions with different values of malleability and/or stiffness.

As shown in FIGS. 3A-3C, a carrier 108 comprises a membrane 114 arranged within a retainer ring cavity defined by sidewalls of a retainer ring 112. The membrane 114 has a central region 116 with a first stiffness and a peripheral region 118 with a second stiffness that is less than the first stiffness. The second stiffness of the peripheral region 118 allows for the peripheral region 118 to expand and/or compress more than the central region 116 in response to an applied force.

As shown in cross-sectional view 300 of FIG. 3A, before being brought into contact with a substrate the membrane 114 has a lower surface 114a with a curved profile. In some embodiments, the central region 116 and the peripheral region 118 may extend along a curved profile that is defined by a continuous function. In other embodiments (not shown), the lower surface 114a may have different curvatures in the central region 116 and in the peripheral region 118. For example, the central region 116 and the peripheral region 118 may extend along a curved profiles that are defined by a non-continuous function. For example, in some embodiments, the different values of stiffness of the central region 116 and the peripheral region 118 result in the central region 116 and the peripheral region 118 having curved profiles defined by slopes that do not converge along an interface between the central region 116 and the peripheral region 118.

As shown in cross-sectional view 302 of FIG. 3B, when a back-side 120b of a substrate 120 is brought into contact with a lower surface 114a of the membrane 114, a shape of the membrane 114 deforms so that the curved profile of the lower surface 114a of the membrane 114 within the central region 116 changes to a flat profile along an interface with the back-side 120b of the substrate 120. The profile of the peripheral region 118 may also change, so that the membrane 114 within the peripheral region 118 has a first part that is in contact with the substrate 120 along a flat profile and a second part having a curved profile that is separated from the substrate 120 (i.e., when a substrate 120 is brought into contact with the membrane 114, the membrane 114 will separate from the substrate 120 at a point located within the peripheral region 118).

The membrane 114 contacts the back-side 120b of the substrate 120 along a first area 304. Along the first area 304, the membrane 114 pushes against the back-side 120b of the substrate 120 with a force $F_1$. However, along outer edges of the substrate 120, the membrane 114 is not able to apply the force $F_1$ on the back-side 120b of the substrate 120 since the membrane 114 is separated from the back-side 120b of the substrate 120 by a space.

As shown in cross-sectional view 306 of FIG. 3C, a liquid and/or gas is supplied to one or more chambers 126 along an upper surface 114b of the membrane 114 via an inlet 128 within a housing 110. The liquid and/or gas increases a pressure along the upper surface 114b of the membrane 114. The pressure causes the peripheral region 118 of the membrane 114 to expand along a lateral direction 308 and along a vertical direction 310. Expansion of the peripheral region 118 of the membrane 114 along the lateral direction 308 and along the vertical direction 310 increases an area of surface contact between the membrane 114 and the back-side 120b of the substrate 120. For example, prior to the application of pressure on the upper surface 114b of the membrane 114 (shown in FIG. 3B), the membrane 114 contacts the substrate 120 along the first area 304. After the application of pressure on the upper surface 114b of the membrane 114 (shown in FIG. 3C), the membrane 114 contacts the substrate 120 along a second area 312 that is larger than the first area 304. By increasing an area of contact between the membrane 114 and the back-side 120b of the substrate 120, the membrane 114 is able to increase an application of the force $F_1$ along outer edges of the substrate 120.

By increasing an application of the force $F_1$ along the outer edges of the substrate 120, non-uniformities in pressure applied to the back-side 120b of the substrate 120 are mitigated. Since the pressure applied to the back-side 120b of the substrate 120 is proportional to a CMP removal rate, the mitigation of non-uniformities in pressure applied to the back-side 120b of the substrate 120 causes CMP removal rates along edges of the substrate 120 to have relatively small deviations from a CMP removal rate at a center of a substrate 120. For example, in some embodiments, the disclosed membrane results in a deviation of CMP removal rates between a center and edges of the substrate 120 that is less than approximately 15% while the 3-sigma deviation of the CMP removal rates may be less than approximately 10%. This deviation is relatively small in comparison to a deviation of CMP removal rates using membrane having a consistent malleability or stiffness over an entire membrane (e.g., which may be up to 20% or greater).

It will be appreciated that in various embodiments, the shape and/or size of the peripheral region may vary while still providing increased pressure to outer edges of a substrate.

Figure 4A:
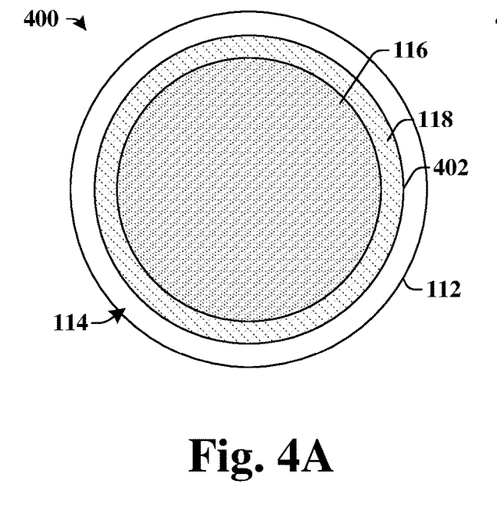
FIGS. 4A-4C illustrate top-views of some alternative embodiments of a disclosed membranes having regions with different values of malleability and/or stiffness.
Figure 4B:
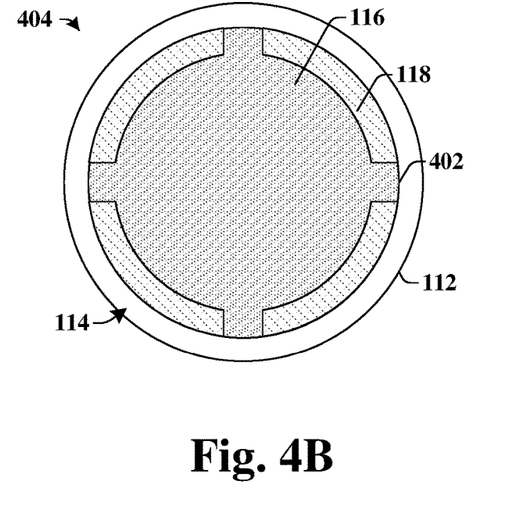
Figure 4C:
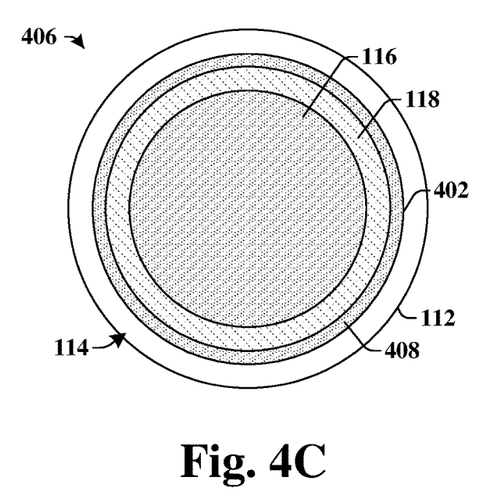

FIGS. 4A-4C illustrate top-views of some alternative embodiments of disclosed membranes having regions with different values of malleability and/or stiffness.

Top-view 400 of FIG. 4A illustrates some embodiments of a membrane 114 including a malleable material. The membrane 114 comprises a central region 116 having a first form of the malleable material having a first stiffness and a peripheral region 118 having a second form of the malleable material having a second stiffness that is less than the first stiffness. The peripheral region 118 comprises a ring that continuously extends around the central region 116. In some embodiments, the peripheral region 118 radially extends from the central region 116 to an outermost edge of the membrane 114 (e.g., an edge abutting a retainer ring 112).

Top-view 404 of FIG. 4B illustrates some alternative embodiments of a membrane 114 including a malleable material. The membrane 114 comprises a central region 116 and a peripheral region 118 region comprising a non-continuous ring disposed between the central region 116 and an outermost edge of the membrane 114. The central region 116 comprises a first form of the malleable material with a first stiffness. The non-continuous ring of the peripheral region 118 has discrete segments of a second form of the malleable material having a second stiffness that is less than the first stiffness. The discrete segments of the second form of the malleable material are separated from one another by the first form of the malleable material.

Top-view 406 of FIG. 4C illustrates some alternative embodiments of a membrane 114 including a malleable material. The membrane 114 comprises a central region 116 having a first form of the malleable material with a first stiffness, a first peripheral region 118 having a second form of the malleable material with a second stiffness that is less than the first stiffness, and a second peripheral region 408 having a third form of the malleable material with a third stiffness that is greater than the second stiffness. In some embodiments, the first stiffness may be substantially equal to the third stiffness. In other embodiments, the first stiffness and the third stiffness may be different. The second peripheral region 408 surrounds the first peripheral region 118, so that the first peripheral region 118 does not extend to an outermost edge 402 of the membrane 114. In some embodiments, the first peripheral region 118 comprises a ring that continuously separates the central region 116 from the second peripheral region 408. In other embodiments, the first peripheral region 118 comprises a non-continuous ring that is between the central region 116 and the second peripheral region 408.

Figure 5:
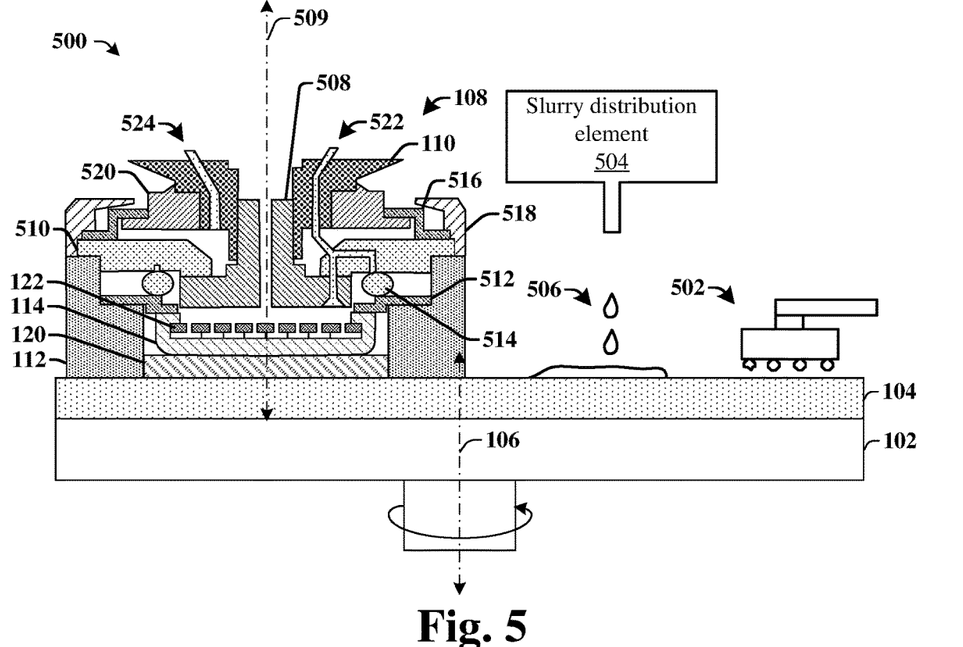
FIG. 5 illustrates a cross-sectional view of some additional embodiments of a CMP tool comprising a carrier including a membrane having regions with different values of malleability and/or stiffness.

FIG. 5 illustrates a cross-sectional view of some additional embodiments of a CMP tool 500 comprising a carrier including a membrane having regions with different values of malleability and/or stiffness.

The CMP tool 500 comprises a polishing pad 104 located on a platen 102 that is configured to rotate the polishing pad 104 about a first axis of rotation 106 during operation of the CMP tool 500. A pad conditioning element 502, comprising a diamond grit conditioning pad, is configured to push on the polishing pad 104 with a downward force that brings the plurality of diamond particles into contact with an upper surface 104u of the polishing pad 104. As the polishing pad 104 is rotated by the platen 102, the diamond particles roughen the upper surface 104u of the polishing pad 104 to provide for improved mechanical polishing.

A slurry distribution element 504 is arranged over the polishing pad 104. The slurry distribution element 504 is configured to deliver a slurry compound 506 to the polishing pad 104 during a CMP process. The slurry compound 506 helps to remove material from the substrate 120. In some embodiments, a composition of the slurry compound 506 may be selected based on a material being removed from a substrate 120. In some embodiments, the substrate 120 comprises a semiconductor body as well as an overlying dielectric material layer (e.g., oxide) and an overlying conductive layer. In some embodiments, the dielectric material layer may comprise oxide (e.g., $SiO_2$, SiCO, or the like) and the conductive layer may comprise a metal (e.g., copper, aluminum, or the like).

A carrier 108 is configured to hold the substrate 120. The carrier 108 includes a retainer ring 112 coupled to a support structure 122. The retainer ring 112 is used to reduce lateral movement of the substrate 120 with respect to the carrier 108 during a CMP process. In some embodiments, the support structure 122 may be coupled to the retainer ring 112 by way of a connection element 512. In some embodiments, the carrier 108 may further comprise a gimbal element 508 that extends through an opening in a housing 110. The gimbal element 508 is configured to rotate about a second axis of rotation 509. In some embodiments, the carrier 108 may further include a ring shaped base 510 located below the housing 110. A clamp ring 514 is coupled to the ring shaped base 510. In some embodiments, the clamp ring 514 is configured to fasten the connection element 512 to the membrane 114. In other embodiments, the clamp ring 514 is configured to fasten the connection element 512 to the support structure 122.

In some embodiments, the clamp ring 514 includes a flexible element enclosing a chamber configured to contain a fluid and/or a gas. A first gas and/or liquid source is coupled to the chamber by way of a first pipe 522. In some embodiments, the first gas and/or liquid source may comprise a first pump configured to control a pressure within the first pipe 522. In some embodiments, the carrier 108 may further comprise a ring-shaped rolling diaphragm 516 clamped between an inner clamp ring 520 coupled to the housing 110 and an outer clamp ring 518 coupled to the base 510. The rolling diaphragm 516 seals a space between housing 110 and base 510 to define a loading chamber. A second gas and/or liquid source is coupled to the loading chamber by way of a second pipe 524. In some embodiments, the second gas and/or liquid source may comprise a second pump configured to control a pressure within the second pipe 524.

FIGS. 6A-9 illustrate some embodiments of a method of forming a membrane for a CMP tool. The membrane has regions with different values of malleability and/or stiffness. Although FIGS. 6A-9 are described with reference to a method, it will be appreciated that the structures shown in FIGS. 6A-9 are not limited to the method but rather may stand alone separate of the method.

Figure 6A:
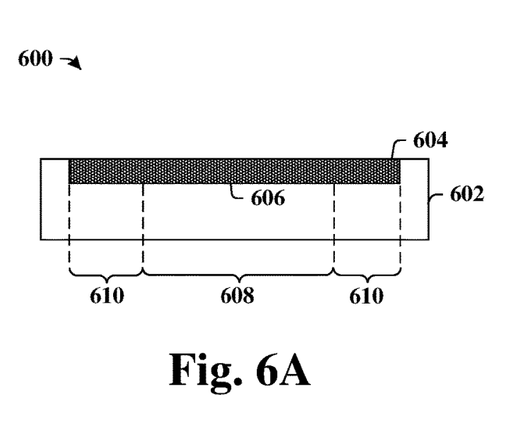
Figure 6B:
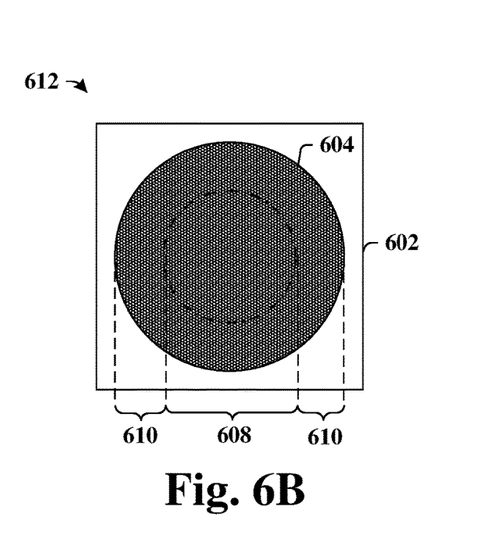

As shown in cross-sectional view 600 of FIG. 6A and top-view 612 of FIG. 6B, a malleable material 604 is formed within a cavity 606 defined by interior surfaces of a membrane mold 602. The cavity 606 defined by the membrane mold 602 has a central region 608 and a peripheral region 610 surrounding the central region 608. In some embodiments, the membrane mold 602 may comprises a rigid structure, such as a plastic or a metal (e.g., aluminum, iron, etc.). In some embodiments, the malleable material 604 may comprise a liquid that is injected into the cavity 606 defined by the membrane mold 602. For example, in some embodiments, the malleable material 604 is silicone. Silicone has a low cost that allows for a low cost membrane to be formed. In other embodiments, the malleable material 604 may be a similar material that is able to be cured to achieve different spatial regions having different values of malleability and/or stiffness.

Figure 7:
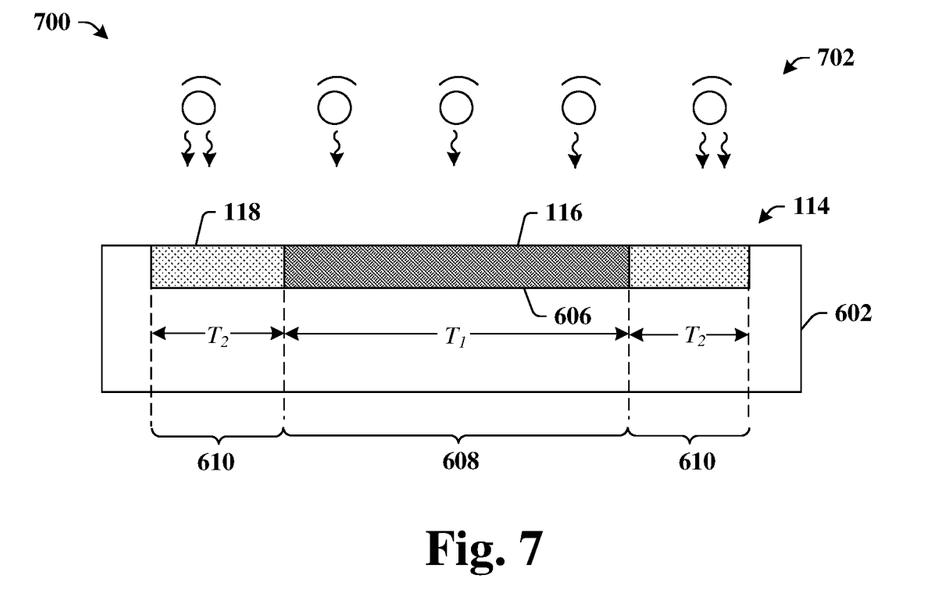

As shown in cross-sectional view 700 of FIG. 7, a curing process is performed that cures the malleable material (604 of FIG. 6A) to form a membrane 114. During the curing process, different parts of the malleable material are heated to different temperatures $T_1$-$T_2$. It has been appreciated that curing some malleable materials, such as silicone, at different temperatures $T_1$-$T_2$ will cause the malleable materials (e.g., silicone) to cure in different ways that result different regions of the membrane 114 having different values of malleability and/or stiffness. In some embodiments, a difference in values between a first temperature $T_1$ and a second temperature $T_2$ is selected to achieve a difference in malleability or stiffness between the central region 116 and the peripheral region 118 (e.g., a difference between the first temperature $T_1$ and the second temperature $T_2$ is selected to provide the central region 116 with a lower malleability and/or greater stiffness than the peripheral region 118). The different values of stiffness within the different regions of the membrane 114 allow the different regions of the membrane 114 to respond (e.g., contact or expand) differently to a force.

For example, in some embodiments, a malleable material within the central region 608 of the membrane mold 602 may be heated to a first temperature $T_1$ and a malleable material within the peripheral region 118 of the membrane mold 602 may be heated to a second temperature $T_2$ that is greater than the first temperature $T_1$. The second temperature $T_2$ is configured to cause the malleable material within the central region 608 of the membrane mold 602 to cure in a way that gives a central region 116 of the membrane 114 a first stiffness, while the second temperature $T_2$ is configured to cause the malleable material within the peripheral region 610 of the membrane mold 602 to cure in a way that gives a peripheral region 118 of the membrane 114 a second stiffness, different than the first stiffness. In some embodiments, the second temperature $T_2$ may be larger than the first temperature $T_1$ by an amount that is greater than or equal to approximately 2° Kelvin (K). In other embodiments, the second temperature $T_2$ may be larger than the first temperature $T_1$ by an amount that is greater than or equal to approximately 5° K.

It has been appreciated that if a stiffness within the central region 116 of the membrane 114 is too low, a pressure that the membrane 114 applies to a substrate is difficult to control. Furthermore, if the stiffness within the peripheral region 118 of the membrane 114 is too high, the membrane 114 will not be malleable enough to apply a pressure to a peripheral region of a substrate and pressure non-uniformities will increase. Therefore, curing the malleable material at a lower temperature in the central region 116 provides the membrane 114 with a higher stiffness that enables the membrane 114 to have a good control of pressure on a substrate, while curing the malleable material at a higher temperature in the peripheral region 118 provides the membrane 114 with a lower stiffness that enables the membrane 114 to provide for a good uniformity of pressure over the substrate.

In some embodiments, a difference between the first temperature $T_1$ and the second temperature $T_2$ may be selected to have a value based upon an observed difference between CMP removal rates at a center of a substrate and at an edge of a substrate. For example, if a removal rate between a center and a peripheral region of a substrate is determined to be 10%, a difference between the first temperature $T_1$ and the second temperature $T_2$ may be selected to have a value of $\delta_1$, while if a removal rate between a center and a peripheral region of a substrate is determined to be 20%, a difference between the first temperature $T_1$ and the second temperature $T_2$ may be selected to have a value of $\delta_2 \geq \delta_1$. By selecting the difference in temperatures based upon a removal rates, the malleability of the peripheral region 118 can be selected to have a value that minimizes the difference in removal rates between a center and a peripheral region of a substrate. In some embodiments, the difference between the first temperature $T_1$ and the second temperature $T_2$ may be may be determined by an iterative process performed on a plurality of test substrates.

In various embodiments, the different temperatures $T_1$-$T_2$ within central region 608 and the peripheral region 610 of the membrane mold 602 may be controlled using different heating elements 702. For example, in some embodiments, the temperatures $T_1$-$T_2$ within the central region 608 and the peripheral region 610 of the membrane mold 602 may be controlled using heating elements 702 comprising heating lamps. In some embodiments, the heating lamps may be located over the membrane mold 602 so that the radiant heat directly contacts the malleable material (e.g., silicone). In other embodiments, the heating lamps may be located below the membrane mold 602, so that the radiant heat contacts the membrane mold 602 along a side opposite the cavity 606. In other embodiments, the temperatures within different regions of the membrane mold 602 may be controlled using heating elements comprising resistive heating element and/or water heating elements contacting (e.g., embedded within) the membrane mold 602.

Figure 8:
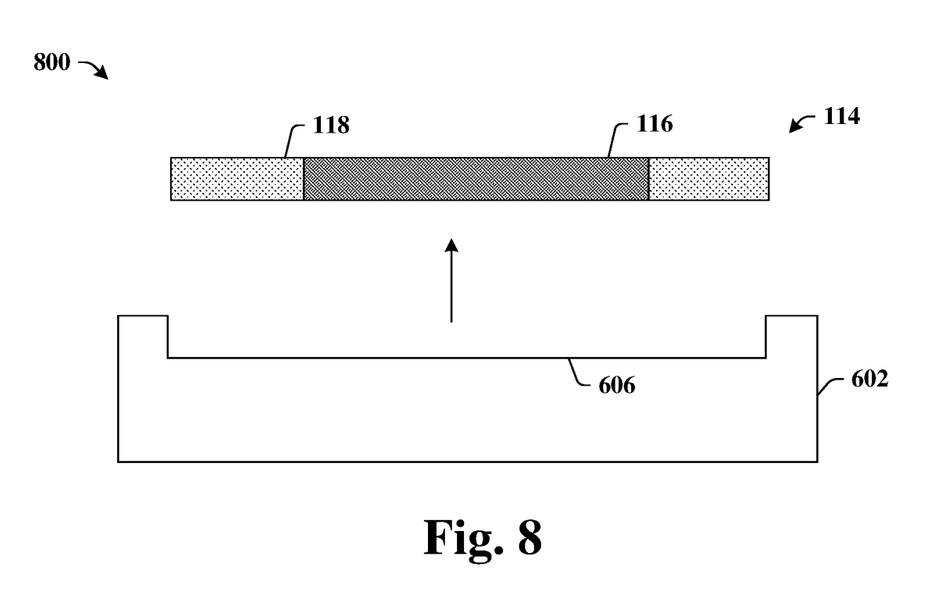

As shown in cross-sectional view 800 of FIG. 8, the membrane 114 is removed from the membrane mold 602 after curing is finished.

Figure 9:
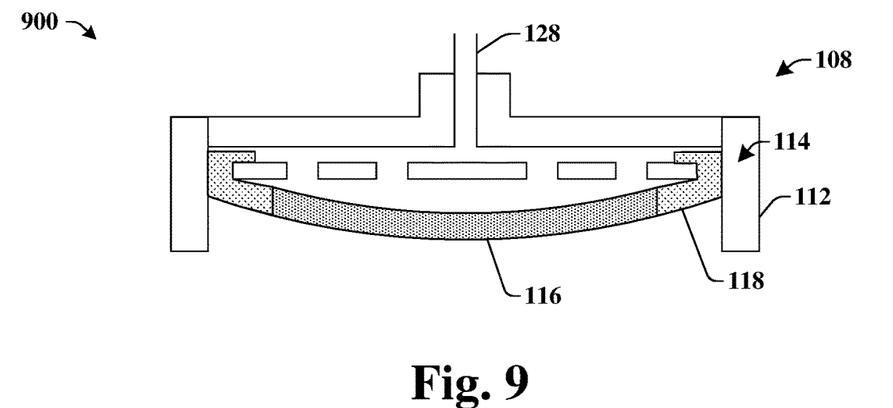

As shown in cross-sectional view 900 of FIG. 9, the membrane 114 is attached to a carrier 108. In some embodiments, the membrane 114 may be attached to the carrier 108 by attaching the membrane 114 to a support structure 122 located between sidewalls of a retainer ring 112.

Figure 10:
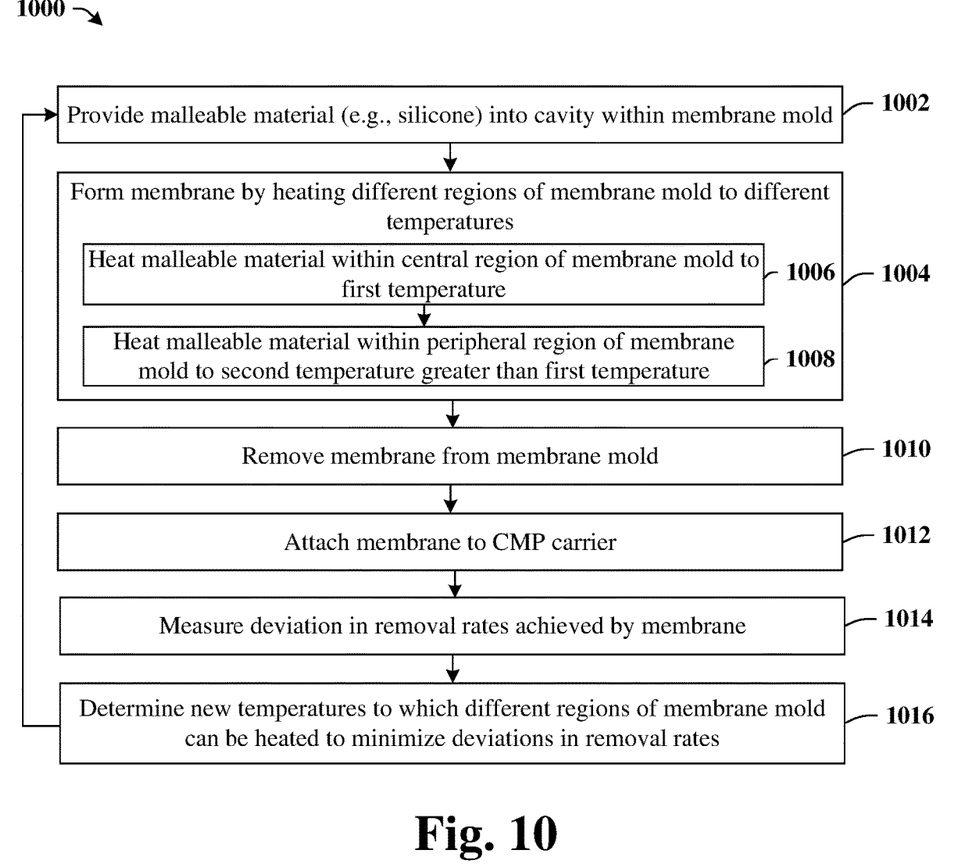
FIG. 10 illustrates a flow diagram of some embodiments of a method of forming a CMP membrane having regions with different values of malleability and/or stiffness.

FIG. 10 illustrates a flow diagram of some embodiments of a method 1000 of forming a CMP membrane having regions with different values of malleability and/or stiffness.

While the disclosed methods (e.g., methods 1000 and 1500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1002, a malleable material (e.g., silicone) is provided into a cavity within a membrane mold. FIG. 6 illustrates a cross-sectional view 600 of some embodiments corresponding to act 1002.

At 1004, the malleable material is cured to form a membrane by heating different regions of the malleable material to different temperatures. FIG. 7 illustrates a cross-sectional view 700 of some embodiments corresponding to act 1004.

In some embodiments, the malleable material may be cured according to acts 1006-1008. At 1006, a malleable material within a central region of the membrane mold is heated to a first temperature. At 1008, a malleable material within a peripheral region of the membrane mold is heated to a second temperature that is greater than the first temperature.

At 1010, the membrane is removed from the cavity of the membrane mold. FIG. 8 illustrates a cross-sectional view 800 of some embodiments corresponding to act 1010.

At 1012, the membrane is attached to a CMP carrier. FIG. 9 illustrates a cross-sectional view 900 of some embodiments corresponding to act 1012.

In some embodiments, the membrane attached to the CMP carrier may be used to perform a CMP process on a substrate and deviations in removal rates achieved by the membrane, between central and peripheral regions of the substrate, are measured at 1014.

At 1016, the deviations may be used to determine new temperatures configured to be used to form an additional membrane that provides for a lower deviation in removal rates. For example, if the membrane is determined to provide a first deviation in removal rates, a first new temperature and a second new temperature may be determined from a first deviation in removal rates and used to form an additional membrane (according to acts 1002-1010) that provides for a second deviation in removal rate that is less than the first deviation in removal rates.

FIGS. 11-14 illustrate cross-sectional views 1100-1400 of some embodiments of a method of performing a chemical mechanical planarization (CMP) process using a disclosed membrane. Although the cross-sectional views 1100-1400 shown in FIGS. 11-14 are described with reference to a method of performing a chemical mechanical planarization (CMP) process, it will be appreciated that the structures shown in FIGS. 11-14 are not limited to the method but rather may stand alone separate of the method.

Figure 11:
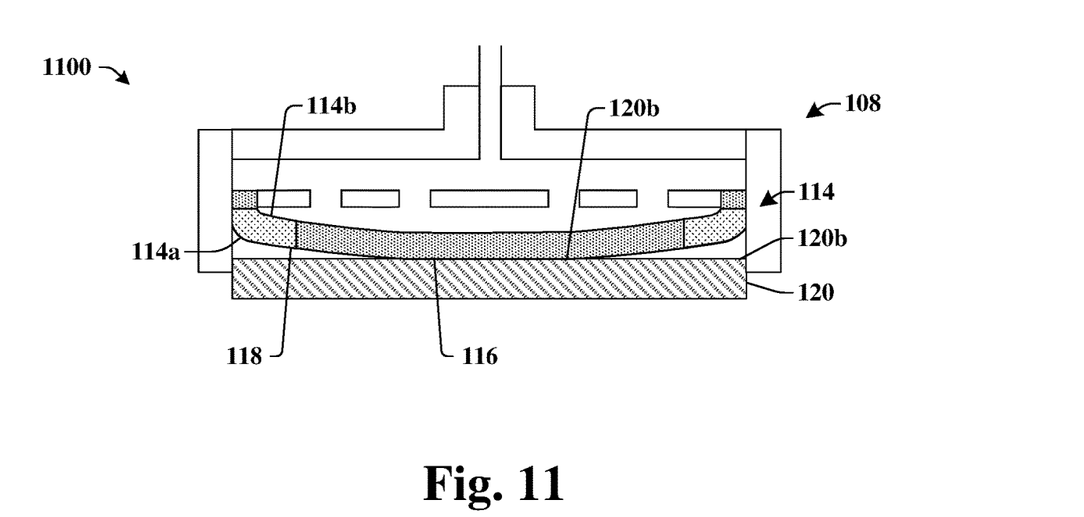
FIGS. 11-14 illustrate cross-sectional views of some embodiments of a method of performing a chemical mechanical planarization (CMP) process.

As shown in cross-sectional view 1100 of FIG. 11, a back-side 120b of a substrate 120 is brought into contact with a lower surface 114a of a membrane 114 of a carrier 108. The membrane 114 comprises a central region 116 having a first stiffness and a peripheral region 118 having a second stiffness that is less than the first stiffness. The different values of stiffness give the peripheral region 118 a greater malleability (e.g., ability to change shape in response to a force) than the central region 116.

Figure 12:
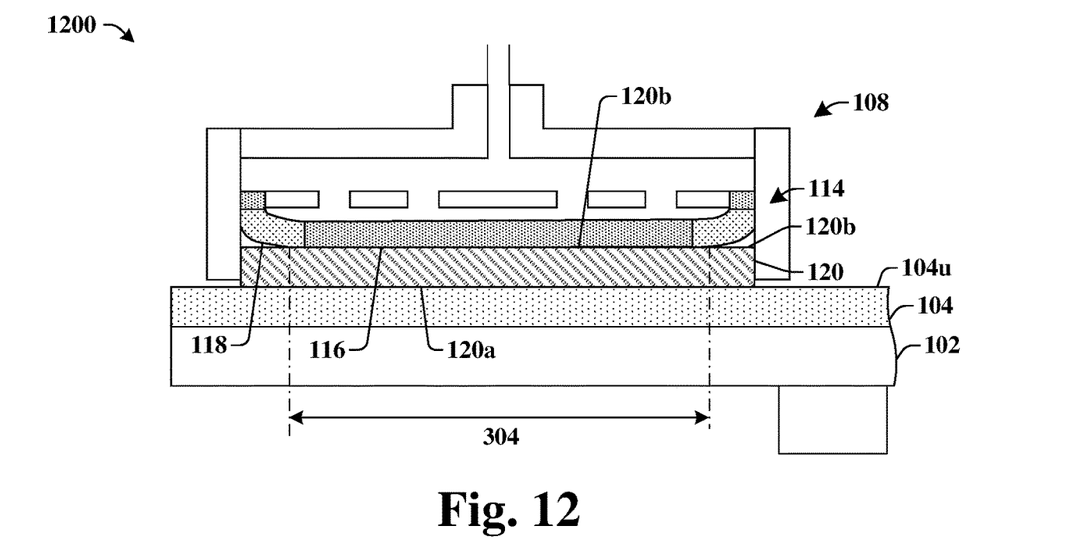

As shown in cross-sectional view 1200 of FIG. 12, the carrier 108 is moved to bring a front-side 120a of the substrate 120 into contact with a roughened upper surface 104u of a polishing pad 104 over a platen 102. When the front-side 120a of the substrate 120 is brought into contact with the polishing pad 104, the substrate 120 pushes on the membrane 114 with a force that causes the central region 116 of the membrane 114 to contact the back-side 120b of the substrate 120 along a substantially flat interface. The peripheral region 118 of the membrane 114 retains a curved profile, which causes the peripheral region 118 of the membrane 114 to be separated from the back-side 120b of the substrate 120 by a space. As shown in cross-sectional view 1200, the membrane 114 contacts the back-side 120b of the substrate along a flat interface having a first area 304.

Figure 13:
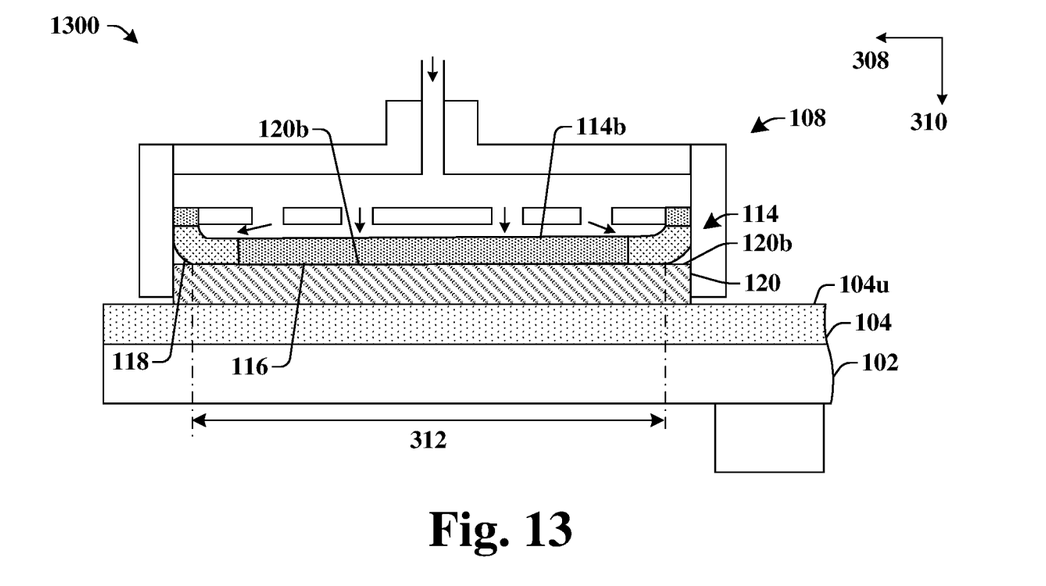

As shown in cross-sectional view 1300 of FIG. 13, a liquid and/or gas is supplied to an upper surface 114b of the membrane 114. The liquid and/or gas increases a pressure along the upper surface 114b of the membrane 114. The pressure causes the peripheral region 118 of the membrane 114 to expand along a lateral direction 308 and along a vertical direction 310. Expansion of the membrane 114 within the peripheral region 118 along the lateral direction 308 and along the vertical direction 310 increases a second area 312 along which the membrane 114 contacts the back-side 120b of the substrate 120. By increasing surface contact between the membrane 114 and the back-side 120b of the substrate 120, the membrane 114 is able to increase a pressure that is applied to the back-side 120b of the substrate 120 along the periphery of the substrate 120, thereby mitigating non-uniformities of the pressure applied to the substrate 120.

Figure 14:
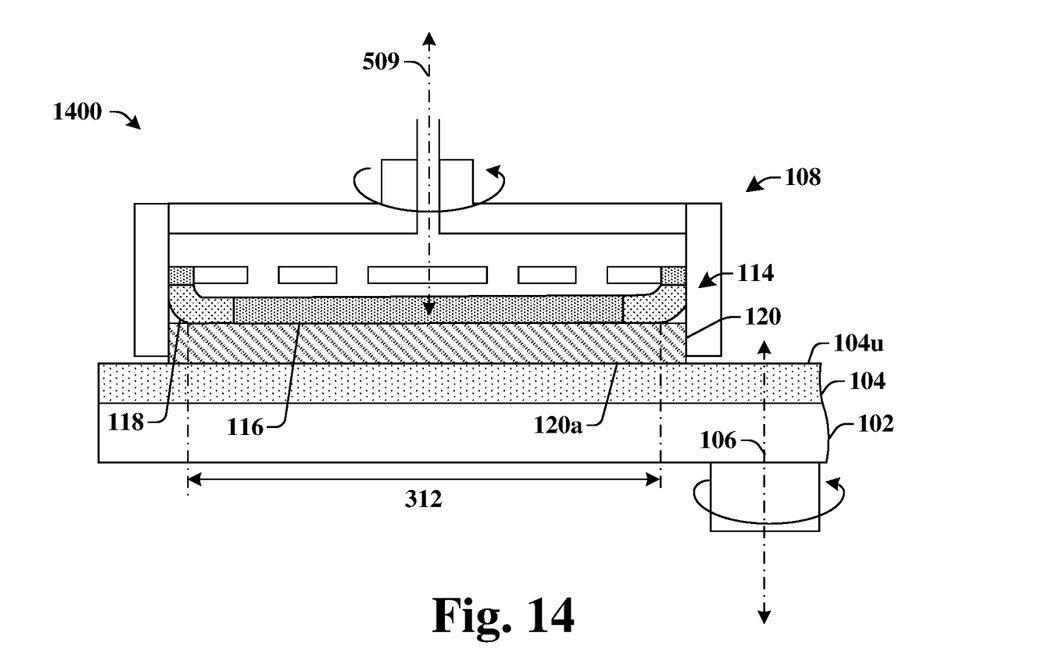

As shown in cross-sectional view 1400 of FIG. 14, the polishing pad 104 is moved relative to the substrate 120. Moving the polishing pad 104 relative to the substrate 120 causes the front-side 120a of the substrate 120 to be slowly removed by a roughened upper surface 104u of the polishing pad 104. In some embodiments, the platen 102 and the polishing pad 104 may be rotated about a first axis of rotation 106 and the carrier 108 and substrate 120 may be rotated about a second axis of rotation 509.

Figure 15:
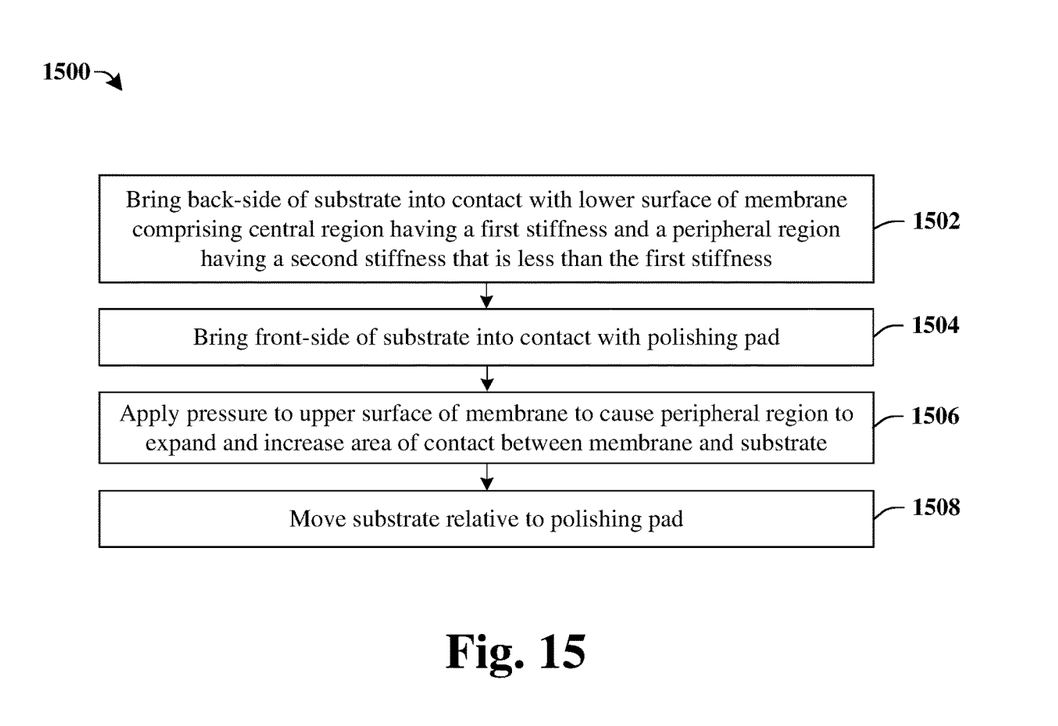
FIG. 15 illustrates a flow diagram of some embodiments of a method of performing a chemical mechanical planarization (CMP) process.

FIG. 15 illustrates a flow diagram of some embodiments of a method 1500 of performing a chemical mechanical planarization (CMP) process.

At 1502, a back-side of a substrate is brought into contact with a lower surface of a membrane comprising central region having a first stiffness and a peripheral region having a second stiffness that is less than the first stiffness. FIG. 11 illustrates a cross-sectional view 1100 of some embodiments corresponding to act 1502.

At 1504, a front-side of the substrate is brought into contact with a polishing pad. FIG. 12 illustrates a cross-sectional view 1200 of some embodiments corresponding to act 1504.

At 1506, a pressure is applied to an upper surface of the membrane. The pressure causes the peripheral region to expand in a lateral and in a vertical direction, and to increase an area of contact between the membrane and the back-side of the substrate. FIG. 13 illustrates a cross-sectional view 1300 of some embodiments corresponding to act 1506.

At 1508, the substrate is moved relative to the polishing pad to perform a CMP process on the front-side of the substrate. FIG. 14 illustrates a cross-sectional view 1400 of some embodiments corresponding to act 1508.

Accordingly, in some embodiments, the present disclosure relates to a method of forming a CMP membrane that is configured to mitigate non-uniformities in pressure applied to a substrate during a CMP process, and an associated apparatus.

In some embodiments, the present disclosure relates to a method of forming a CMP membrane. The method includes providing a malleable material within a cavity in a membrane mold, the cavity has a central region and a peripheral region surrounding the central region; and curing the malleable material to form a membrane, curing the malleable material includes heating the malleable material within the central region of the membrane mold to a first temperature and heating the malleable material within the peripheral region of the membrane mold to a second temperature that is greater than the first temperature. In some embodiments, the second temperature is larger than the first temperature by an amount that is equal to approximately 2° Kelvin (K) or more. In some embodiments, the peripheral region extends from the central region to an outermost edge of the cavity. In some embodiments, the peripheral region extends as a continuous ring around the central region. In some embodiments, heating the malleable material within the peripheral region to the first temperature and heating the malleable material within the central region to the second temperature is performed by a plurality of heating lamps. In some embodiments, heating the malleable material within the peripheral region to the first temperature and heating the malleable material within the central region to the second temperature is performed by resistive heating elements embedded within the membrane mold. In some embodiments, a difference between the first temperature and the second temperature is configured to achieve a difference in malleability or stiffness between a central region of the membrane and a peripheral region of the membrane. In some embodiments, the malleable material consist of silicone. In some embodiments, the method further includes attaching the membrane to a CMP carrier; performing a CMP process on a substrate using the membrane; determining a first deviation in removal rates between a central region of the substrate and a peripheral region of the substrate; and determining a first new temperature and a second new temperature, the first new temperature and the second new temperature are configured to be used to form an additional membrane that provides for a second deviation in removal rate that is less than the first deviation in removal rates. In some embodiments, the method further includes providing additional silicone within the cavity defined by the interior surfaces of the membrane mold; heating the additional silicone within the central region of the membrane mold to the first new temperature; and heating the additional silicone within the peripheral region of the membrane mold to the second new temperature.

In other embodiments, the present disclosure relates to a method of forming a CMP membrane. The method includes providing silicone within a cavity defined by interior surfaces of a membrane mold, the cavity includes a central region and a peripheral region surrounding the central region; heating the silicone within the central region of the membrane mold to a first temperature that causes the silicone within the central region of the membrane mold to have a first stiffness; and heating the silicone within the peripheral region of the membrane mold to a second temperature that causes the silicone within the peripheral region of the membrane mold to have a second stiffness that is less than the first stiffness. In some embodiments, heating the silicone within the peripheral region to the first temperature and heating the silicone within the central region to the second temperature is performed by a plurality of heating lamps. In some embodiments, the second temperature is larger than the first temperature by an amount that is greater than or equal to approximately 2° Kelvin (K). In some embodiments, the peripheral region extends from the central region to an outermost edge of the cavity. In some embodiments, the silicone is transparent. In some embodiments, the peripheral region is a non-continuous ring comprising discrete segments that are separated by the central region.

In yet other embodiments, the present disclosure relates to a CMP tool. The CMP tool includes a housing; a retainer ring attached to the housing and configured to laterally surround a substrate; and a malleable membrane having a lower surface configured to contact a back-side of the substrate, the malleable membrane includes a central region having a first stiffness and a first peripheral region surrounding the central region and having a second stiffness less than the first stiffness. In some embodiments, the malleable membrane further includes a second peripheral region separated from the central region by the first peripheral region and having a third stiffness that is less than the second stiffness. In some embodiments, the central region includes a first form of silicone having the first stiffness and the first peripheral region includes a second form of silicone having the second stiffness; the first form of silicone laterally contacts the second form of silicone. In some embodiments, the CMP tool further includes a support structure disposed between the housing and the malleable membrane, the malleable membrane is coupled to the support structure, and the support structure includes a plurality of apertures defined by sidewalls extending through the support structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical planarization (CMP) tool, comprising:
   a carrier;
   a malleable membrane coupled to the carrier and having a lower surface facing away from the carrier, wherein the lower surface of the malleable membrane comprises a first malleable material within a central region of the lower surface and a second malleable material within a peripheral region of the lower surface, which surrounds the central region; and
   wherein the first malleable material of the lower surface provides the central region of the lower surface with a first stiffness and the second malleable material of the lower surface provides the peripheral region of the lower surface with a second stiffness that is different than the first stiffness.

2. The CMP tool of claim 1, wherein the second malleable material laterally contacts the first malleable material.

3. The CMP tool of claim 1, wherein the first malleable material and the second malleable material are different forms of a same substance.

4. The CMP tool of claim 1, wherein the first malleable material and the second malleable material have substantially equal thicknesses.

5. The CMP tool of claim 1, wherein the first malleable material and the second malleable material are silicone.

6. The CMP tool of claim 1, wherein the malleable membrane has a topmost surface opposing the lower surface, the topmost surface being separated from the lower surface by equal distances in the central region and in the peripheral region.

7. The CMP tool of claim 1, wherein the second malleable material continuously extends in a continuous and unbroken loop surrounding an outermost perimeter of the first malleable material.

8. The CMP tool of claim 1, wherein the lower surface of the malleable membrane is configured to contact a backside of a substrate during a CMP process, the lower surface of the malleable membrane being configured to contact a part, but not all of the backside of the substrate during the CMP process.

9. The CMP tool of claim 1, wherein the lower surface of the malleable membrane comprises a curved surface facing away from the carrier.

10. A chemical mechanical planarization (CMP) tool, comprising:
    a carrier configured to laterally surround a substrate;
    a malleable membrane coupled to the carrier and having a lower surface facing away from the carrier, wherein the lower surface of the malleable membrane comprises a first malleable material within a central region of the lower surface and a second malleable material within a peripheral region of the lower surface that surrounds the central region; and
    wherein the first malleable material of the lower surface has a first malleability that causes an entirety of the first malleable materials to contact the substrate and the second malleable material of the lower surface has a second malleability that is different than the first malleability and that causes a curved surface of the second malleable material to partially contact the substrate.

11. The CMP tool of claim 10, wherein the first malleable material completely covers an entirety of a side of the second malleable material that faces the first malleable material.

12. The CMP tool of claim 10, wherein the malleable membrane has a first thickness measured along an outermost sidewall of the malleable membrane and a second thickness measured through a lateral center of the malleable membrane, the first thickness equal to the second thickness.

13. The CMP tool of claim 10, wherein the curved surface extends over a height that is greater than one-half of a thickness of the malleable membrane.

14. The CMP tool of claim 10, wherein the first malleable material of the lower surface and the second malleable material of the lower surface form a smooth upper surface and a smooth lower surface of the malleable membrane.

15. A method of forming a chemical mechanical planarization (CMP) membrane, comprising:
   providing a malleable material within a cavity in a membrane mold, wherein the cavity comprises a central region and a peripheral region surrounding the central region;
   heating the malleable material within the central region of the membrane mold to a first temperature to cause the malleable material to have a first malleability within the central region; and
   heating the malleable material within the peripheral region of the membrane mold to a second temperature that is greater than the first temperature, wherein heat applied to the malleable material within the peripheral region causes the malleable material of the membrane to have a second malleability within the peripheral region that is greater than the first malleability.

16. The method of claim 15, wherein an entirety of an outermost sidewall of the CMP membrane has the second malleability.

17. The method of claim 15, further comprising:
   attaching the CMP membrane to a carrier; and
   bringing the CMP membrane into contact with a substrate, wherein an entirety of the malleable material within the central region contacts the substrate and a part, but not all, of the malleable material within the peripheral region contacts the substrate.

18. The method of claim 15, further comprising:
   attaching the CMP membrane to a carrier; and
   bringing the CMP membrane into contact with a substrate, wherein the CMP membrane comprises a curved surface facing away from the substrate after being brought into contact with the substrate.

19. The method of claim 15, wherein the malleable material within the central region and the peripheral region have substantially equal thicknesses.

20. The method of claim 15, wherein the malleable material within the peripheral region continuously extends in a continuous and unbroken loop surrounding the malleable material within the central region.

* * * * *